United States Patent
Lee et al.

(10) Patent No.: US 8,277,558 B2
(45) Date of Patent: Oct. 2, 2012

(54) CZOCHRALSKI APPARATUS FOR GROWING CRYSTALS AND PURIFICATION METHOD OF WASTE SALTS USING THE SAME

(75) Inventors: Jong-Hyeon Lee, Daejeon (KR); Han-Soo Lee, Daejeon (KR); In-Tae Kim, Daejeon (KR); Yoon-Sang Lee, Daejeon (KR); Eung-Ho Kim, Daejeon (KR)

(73) Assignees: Korea Atomic Energy Research Institute (KR); Korea Hydro & Nuclear Power Co., Ltd. (KR)

( * ) Notice: Subject to any disclaimer, the term of this patent is extended or adjusted under 35 U.S.C. 154(b) by 1368 days.

(21) Appl. No.: 12/062,463

(22) Filed: Apr. 3, 2008

(65) Prior Publication Data
US 2009/0139444 A1    Jun. 4, 2009

(30) Foreign Application Priority Data
Nov. 29, 2007   (KR) .................. 10-2007-0122929

(51) Int. Cl.
C30B 11/00 (2006.01)
C30B 15/00 (2006.01)
C30B 21/06 (2006.01)
C30B 27/02 (2006.01)
C30B 28/10 (2006.01)
C30B 30/04 (2006.01)
C30B 35/00 (2006.01)

(52) U.S. Cl. .............. 117/200; 117/11; 117/13
(58) Field of Classification Search ............. 117/13, 117/11, 200
See application file for complete search history.

(56) References Cited

U.S. PATENT DOCUMENTS
| | | | | |
|---|---|---|---|---|
| 4,211,600 A | * | 7/1980 | Cole | 117/17 |
| 4,485,072 A | * | 11/1984 | Apilat et al. | 117/218 |
| 2005/0268840 A1 | * | 12/2005 | Inagaki et al. | 117/13 |

OTHER PUBLICATIONS

Hinks, et al. "The Purification and Crystal Growth of Lithium Chloride," *Materials Research Bulletin.*, vol. 9, pp. 53-64, 1974.
Lexa, et al. "Occlusion and Ion Exchange in the Molten (Lithium Chloride-Potassium Chloride-Alkali Metal Chloride) Salt + Zeolite 4A System with Alkali Metal Chlorides of Sodium, Rubidium, and Cesium," *Metallurgical and Materials Transactions B*, vol. 32B, pp. 429-435, Jun. 2001.
Pereira et al. "Incorporation of Radionuclides from the Electrometallurgical Treatment of Spent Fuel into a Ceramic Waste Form" *Mater Res Soc Proc*, vol. 556, pp. 115-120, 1999.

* cited by examiner

*Primary Examiner* — James McDonough
(74) *Attorney, Agent, or Firm* — Knobbe Martens Olson & Bear, LLP

(57) ABSTRACT

Disclosed are a czochralski apparatus for growing crystals and a purification method of waste salts using the same. More particularly, the present invention provides a czochralski apparatus for growing crystals comprising screw thread for fixing salt crystals mounted on a pulling bar of the apparatus in order to prevent desorption of crystals caused by load thereof during a crystal growing process without requiring alternative seed crystals and, in addition, a method for purification of waste salts, which can isolate impurities from molten waste salts using a czochralski crystal growing process without alternative adsorption medium, does not generate secondary wastes and may continuously purify the waste salts.

12 Claims, 7 Drawing Sheets

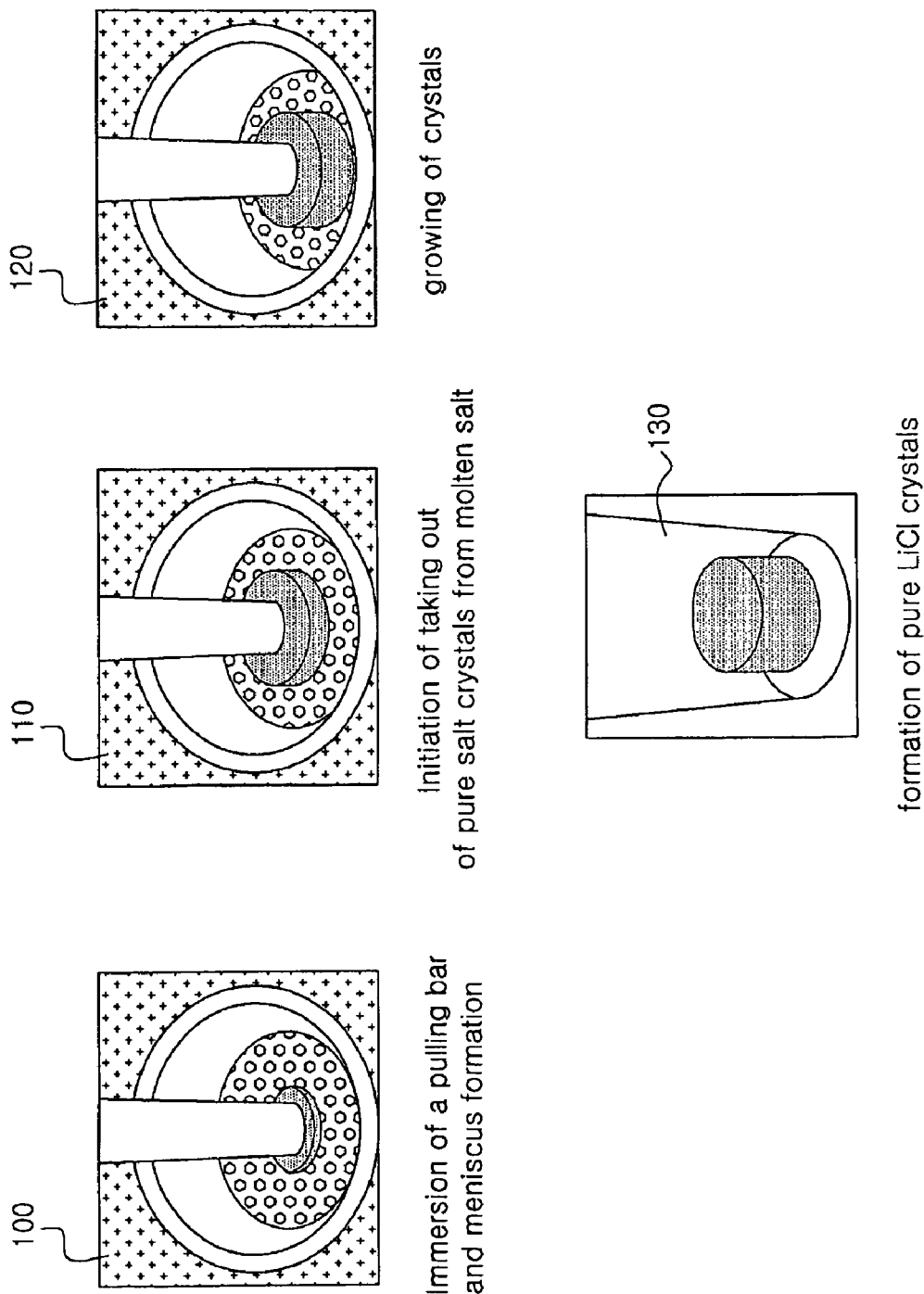

CZOCHRALSKI APPARATUS FOR GROWING CRYSTALS AND PURIFICATION METHOD OF WASTE SALTS USING THE SAME

CROSS-REFERENCE TO RELATED APPLICATION

This application claims priority to Korean Patent Application No. 10-2007-0122929, filed on Nov. 29, 2007, in the Korean Intellectual Property Office, the entire contents of which are hereby incorporated by reference.

BACKGROUND

1. Field

The present invention relates to czochralski apparatuses for growing crystals and purification methods of waste salts using the same, more particularly, to a czochralski apparatus for growing crystals comprising a fixation screw assembly for fixing salt crystals mounted on a bottom end of a pulling bar of the apparatus in order to prevent desorption of crystals caused by load thereof during a crystal growing process without requiring alternative seed crystals and, in addition, a method for purification of waste salts, which can isolate impurities from molten waste salts using a czochralski crystal growing process without alternative adsorption medium, does not generate secondary wastes and may continuously purify the waste salts.

2. Description of the Related Technology

Conventionally known electrolytic reduction processes for spent oxide nuclear fuel convert constitutional elements into metal ingredients in LiCl molten salt baths. For instance, all of fission products excluding alkali metal, alkali-earth metal and some of rare-earth elements, as well as uranium and plutonium are converted into metal ingredients.

Since high heat generating chlorides of cesium Cs and strontium Sr or other chlorides dissolved in the LiCl molten salt in an electrolytic reduction process have relatively high standard free energy of formation (commonly called Gibbs free energy, Gf) and reduction potential and cannot be substantially dissociated by electrolysis, chemical processes and/or electrolysis.

Accordingly, in order to reuse salts, use of specific media such as zeolite is taken into account to isolate Cs and/or Sr from the salts. Adsorption of Cs and/or Sr using zeolite has been reported by Pereira C, et al. (Mater Res Soc Proc. 1999, vol 556, pp 115-120) and Lexa D, et al. (Metallurgical and Materials Transactions B. 2001; 32B:429-435), which is now known as one of the most practical processes for treatment or reuse of molten waste salts generated during treatment of nuclear spent fuels.

However, such adsorption method has a restriction of amount of fission products to be adsorbed and exhibits large quantities of adsorption medium based wastes generated after adsorption step.

Czochralski process, one of crystal growing processes, is commonly available in industrial semiconductor applications to mostly produce single silicon crystals. An illustrative example of czochralski process for LiCl treatment was reported by Hinks et al. in Materials Research Bulletin, vol 9, pp 53-64, 1974, that removed Fe, Co, Ni, Ca and the like by a zone refining process and produced LiCl single crystals.

Therefore, there is still a requirement for developing an improved process that can produce multi-crystalline LiCl and remove CsCl and $SrCl_2$ contained in LiCl generated during treatment of nuclear spent fuels.

SUMMARY

Accordingly, the present invention is directed to solve the problems described above and an object of the present invention is to provide a czochralski apparatus for growing crystals with construction in that a fixation screw body is mounted on the bottom end of a pulling bar of the apparatus to prevent desorption of crystals caused by load thereof during a crystal growing process without requiring alternative seed crystals.

Another object of the present invention is to provide a method for purification of waste salts that isolates impurities from molten waste salts without use of adsorption medium, does not generate secondary wastes and can continuously purify the waste salts.

In order to achieve the above objects, the present invention provides a czochralski apparatus for growing crystals, comprising: a melting pot having a heating part to dissolve raw salts at controlled temperature; a ascending or descending device located at center of bottom end of the melting pot to move the melting pot upward or downward; a pulling bar located at center of upper end of the melting pot to take out desired pure salt crystals from molten raw salt containing impurities; and a fixation screw assembly for fixing salt crystals being in contact with the molten raw salts containing impurities, which includes a fixation screw for salt crystals mounted on the bottom end of the pulling bar capable of rotating, a thread portion for salt crystals formed on an outer surface of the fixation screw, and an exhaust port formed at upper end portion of the fixation screw so as to enable the molten raw salt to be easily penetrated into the fixation screw.

Also, the present invention provides a czochralski apparatus for growing crystals, comprising: a melting pot having a heating part to dissolve raw salts at controlled temperature; a pulling bar located at center of upper end of the melting pot to take out desired pure salt crystals from molten raw salt containing impurities; an ascending or descending device located at center of upper end of the pulling bar to move the pulling bar upward or downward; and a fixation screw assembly for fixing salt crystals being in contact with the molten raw salts containing impurities, which includes a fixation screw for salt crystals mounted on the bottom end of the pulling bar capable of rotating, a thread portion for salt crystals formed on an outer surface of the fixation screw, and an exhaust port formed at upper end portion of the fixation screw so as to enable the molten raw salt to be easily penetrated into the fixation screw.

The present invention further provides a method for purification of waste salts by a czochralski crystal growing process in order to regenerate the waste salts generated from an electrolytic reduction process for spent oxide nuclear fuel, which recovers desired pure salt crystals from the molten waste salts containing impurities using the czochralski crystal growing process.

As conventional czochralski crystal growing apparatus are mostly used for single crystal growth, thus, these have a specific construction of growing a desired material from seed crystals thereof. In the contrast, as described above, the present inventive purification method needs no seed crystals and has a merit of preventing desorption of crystals caused by load of the crystals during a crystal growing process by mounting a fixation screw assembly on the bottom end of the pulling bar.

The waste salts purification method of the present invention has advantages in that this method does not generate secondary waste and can continuously purify the waste salts by using a czochralski crystal growing process to remove impurities from the molten waste salts without use of adsorption medium.

Alternatively, the waste salts purification method of the present invention applies segregation principles caused by solubility difference between a melting phase and a solid phase of impurities in the molten waste salts to recover pure salt crystals, so that the method can achieve regeneration of desired salts and considerably reduce waste salt treatment cost among expenses for dry treatment of nuclear fuel, thereby improving economic features thereof.

Features of the present invention described above and other advantages will be more clearly understood by the following non-limited examples, which are not intended to restrict the scope of the invention but are instead illustrative embodiments of the present invention.

BRIEF DESCRIPTION OF THE DRAWINGS

These and other objects, features, aspects, and advantages of the present invention will be more fully described in the following detailed description for preferred embodiments and examples, taken in conjunction with the accompanying drawings. In the drawings:

FIG. 7 illustrates a process for growing pure LiCl crystals from LiCl—CsCl molten salt described in an example of the present invention.

DETAILED DESCRIPTION OF THE INVENTION

Figure 1:
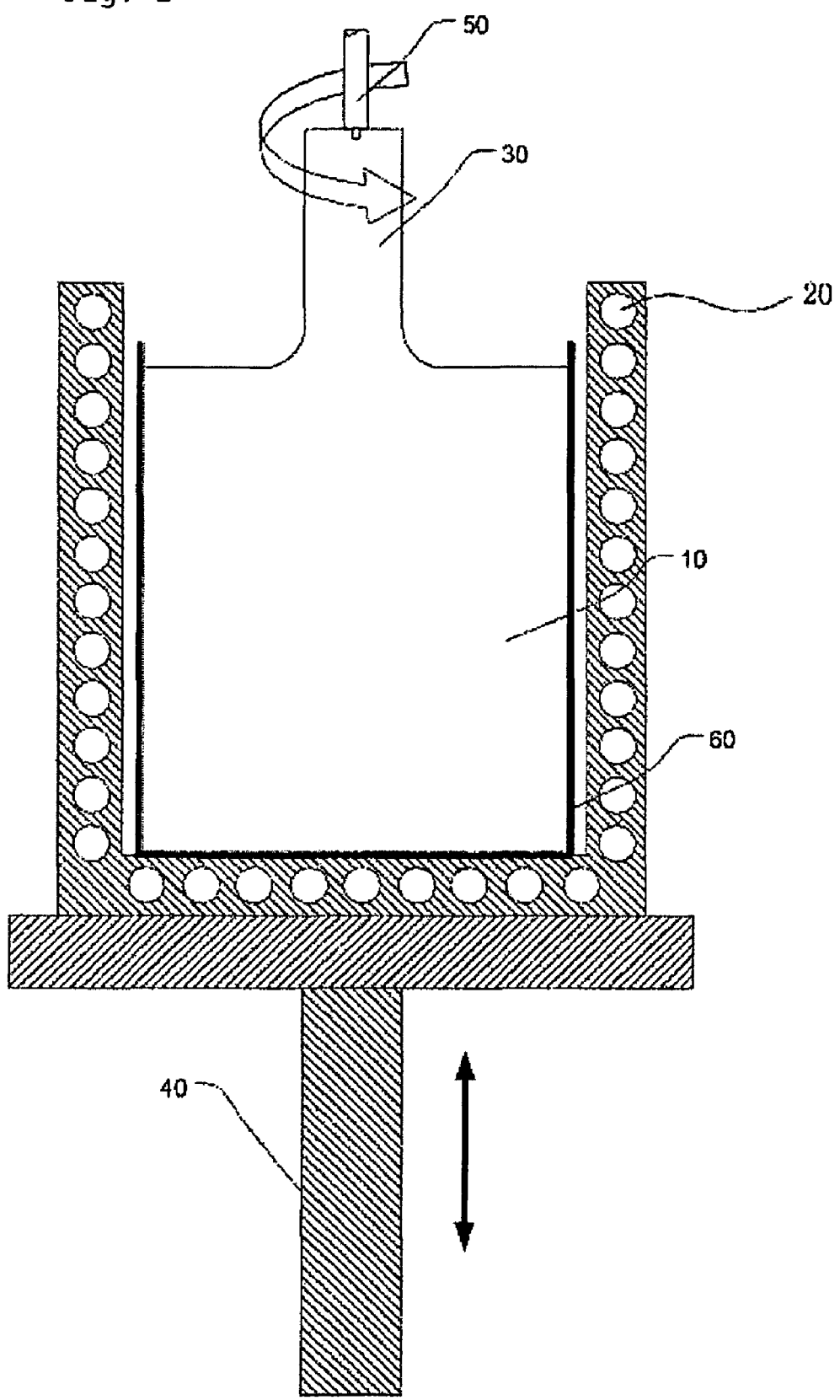
FIG. 1 is a schematic view of a czochralski apparatus for growing crystals of molten salt according to a preferred embodiment of the present invention.

According to first aspect of the present invention, there is provided a czochralski apparatus for growing crystals, comprising: a melting pot having a heating part to dissolve raw salts at controlled temperature; a ascending or descending device located at center of bottom end of the melting pot to move the melting pot upward or downward; a pulling bar located at center of upper end of the melting pot to take out desired pure salt crystals from molten raw salt containing impurities; and a fixation screw assembly for fixing salt crystals being in contact with the molten raw salts containing impurities, which includes a fixation screw for salt crystals mounted on the bottom end of the pulling bar capable of rotating, a thread portion formed on an outer surface of the fixation screw, and an exhaust port formed at upper end portion of the fixation screw so as to enable the molten raw salts to be easily penetrated into the salt crystals.

According to second aspect of the present invention, there is provided a czochralski apparatus for growing crystals, comprising: a melting pot having a heating part to dissolve raw salts at controlled temperature; a pulling bar located at center of upper end of the melting pot to take out desired pure salt crystals from molten raw salt containing impurities; an ascending or descending device located at center of upper end of the pulling bar to move the pulling bar upward or downward; and a fixation screw assembly for fixing salt crystals being in contact with the molten raw salts containing impurities, which includes a fixation screw for salt crystals mounted on the bottom end of the pulling bar capable of rotating, a thread portion formed on an outer surface of the fixation screw, and an exhaust port formed at upper end portion of the fixation screw so as to enable the molten raw salt to be easily penetrated into the salt crystals.

The czochralski apparatus of the present invention may have at least one fixation screw assembly for salt crystals, more particularly, may preferably include at least two fixation screw assemblies and, more preferably two fixation screw assemblies and have a gap between the fixation screw assemblies, in view of improvement of contact strength between fixation screw and salt crystals so as to tolerate load increased by crystal growth, but be not particularly limited thereto.

The czochralski apparatus of the present invention uses metal materials for fabricating the pulling bar, for example, stainless steel, copper, or nickel group containing super alloys.

For the czochralski apparatus of the present invention, illustrative examples of the impurities are Cs salts, Sr salts or mixture thereof. However, the impurities are not particularly limited to the above examples, but include fluoride based salts so far as such salts are not mutually soluble.

The salts of Cs salts or Sr salts are preferably chloride salts, but are not particularly limited thereto so far as these are not mutually soluble.

The desired salt crystals are preferably Li salt crystals, but are not particularly limited thereto so far as these are not mutually soluble.

Salts of the salt crystals are preferably chloride salts, but are not particularly limited thereto so far as these are not mutually soluble.

The czochralski crystal growing apparatus of the present invention will be described in detail with reference to the accompanying drawings.

FIG. 1 is a schematic view illustrating an example of the czochralski crystal growing apparatus according to the present invention. Referring to FIG. 1, the czochralski apparatus comprises a melting pot 60 having a heating part 20 to dissolve raw salts at controlled temperature, a ascending or descending device 40 to move a melting pot 60 upward or downward, and a pulling bar 50 to take out desired pure salt crystals 30 from molten salt 10.

Figure 2:
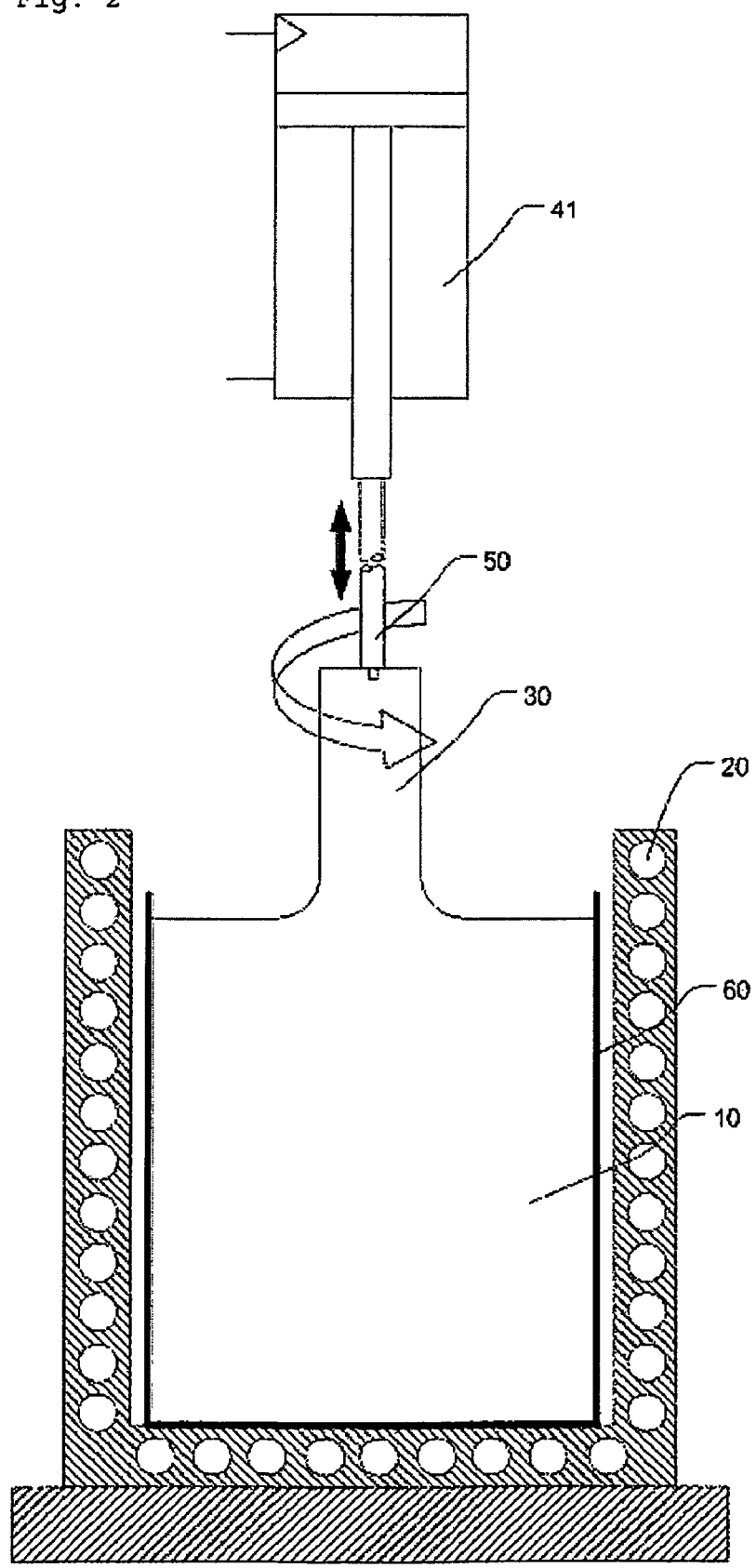
FIG. 2 is a schematic view of a czochralski apparatus for growing crystals of molten salt according to another preferred embodiment of the present invention.

FIG. 2 is a schematic view illustrating another example of the czochralski crystal growing apparatus according to the present invention. Referring to FIG. 2, the czochralski apparatus comprises a melting pot 60 having a heating part 20 to dissolve raw salts at controlled temperature, a pulling bar 50 to take out desired pure salt crystals 30 from molten salt 10, and an ascending or descending device 41 to move the pulling bar 50 upward.

Since the czochralski apparatus of the present invention has the pulling bar 50 made of metal materials in place of seed crystals of conventional czochralski apparatuses for growing crystals, interfacial bonding force between the pulling bar 50 and the molten salt crystals cannot tolerate load increased during the crystal growing process.

Figure 3:
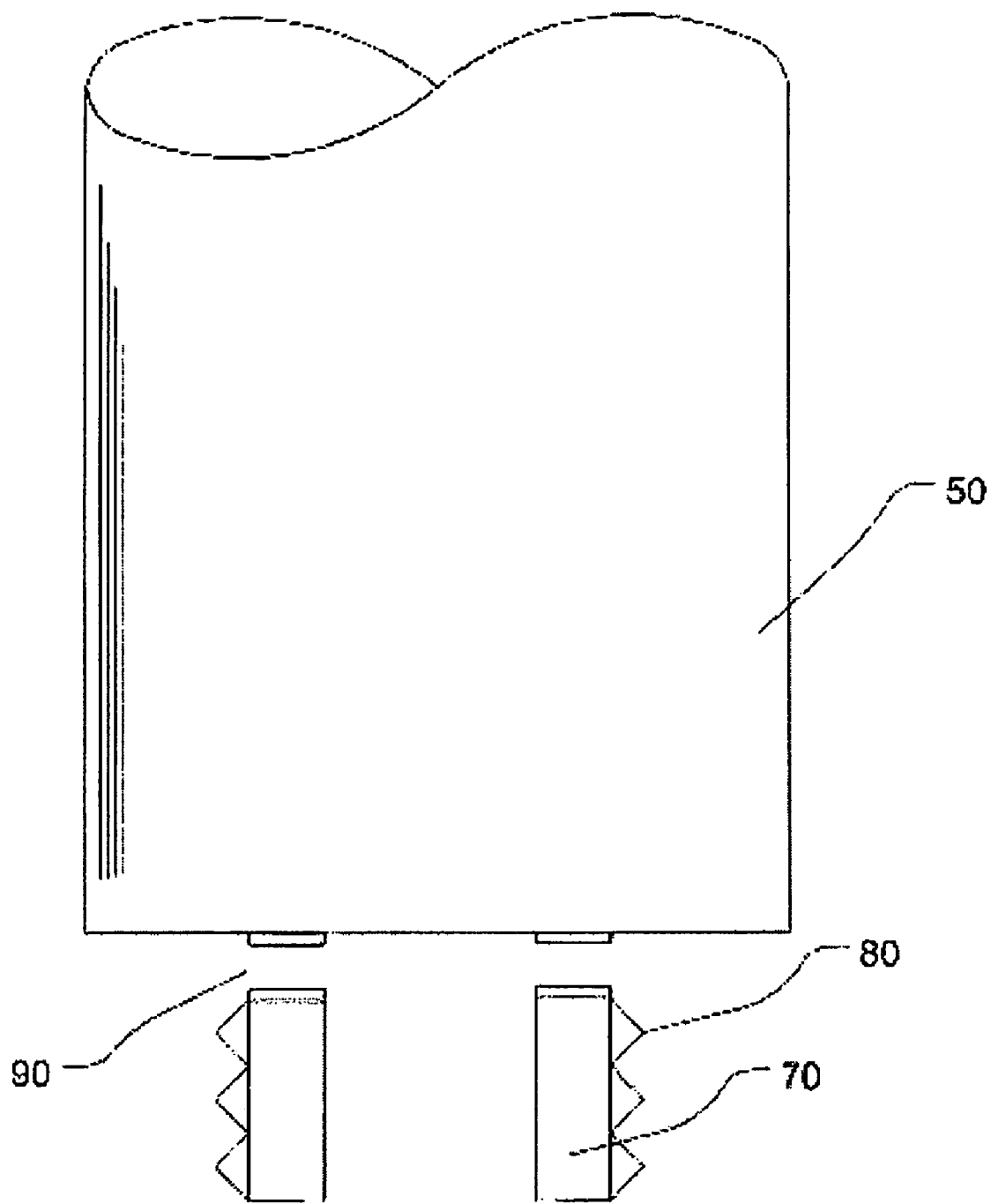
FIG. 3 illustrates a pulling bar for taking out molten salt crystals formed and a fixation screw assembly according to the preferred embodiment of the present invention.

Thus, end portion of the pulling bar 50 becomes deformed as shown in FIG. 3, which more illustrates in detail the pulling bar 50 shown in FIG. 1 or FIG. 2.

Referring to FIG. 3, the czochralski crystal growing apparatus according to the present invention further comprises a fixation screw assembly for fixing salt crystals being in contact with the molten raw salts containing impurities. The fixation screw assembly includes a fixation screw 70 for salt crystals mounted on the bottom end of the pulling bar 50 capable of rotating, a thread portion 80 for salt crystals formed on an outer surface of the fixation screw 70, and an exhaust port 90 formed at upper end portion of the fixation screw 70.

The fixation screw 70 for salt crystals are in contact with initially molten salt 10 and, when directly immersing the fixation screw 70 in the molten salt until tops of fixation screw 70 for salt crystals 80 are immersed in the molten salt 10, the pulling bar 50 is rigidly combined with the solidified salts. Herein, the exhaust port 90 formed at upper end of the fixation screw 70 allows the molten raw salt to be easily penetrated into the fixation screw 70.

If bottom end of the pulling bar 50 is immersed in the molten salt during rotation thereof, the molten salt is deposited to upper end of the fixation screw 70 to generate desired pure salt crystals.

According to third aspect of the present invention, there is provided a method for purification of waste salts by a czochralski crystal growing process to regenerate the waste salts generated by an electrolytic reduction process for spent oxide nuclear fuel, which recovers desired pure salt crystals from the molten waste salt containing impurities using the czochralski crystal growing process.

The waste salt purification method of the present invention uses an improved apparatus from czochralski apparatuses for growing crystals commonly available in the related arts and adapts segregation principles caused by solubility difference between molten phase and solid phase of impurities (for example, CsCl and $SrCl_2$) for desired salt crystals (for example, LiCl) contained in the molten waste salt in order to recover the desired pure salt crystals from molten waste salt mixture.

With regard to the method for purification of waste salts according to the present invention, the czochralski crystal growing process includes the steps of: (a) forming a meniscus around the pulling bar by fixing the pulling bar of the czochralski apparatus for growing crystals and ascending the melting pot to immerse the pulling bar in molten salt waste containing impurities while rotating the pulling bar; (b) producing the meniscus with desired diameter size by stopping ascent of the melting pot to obtain the desired diameter size and maintaining constant height of the melting pot; (c) initiating taking out desired pure salt crystals from the molten salt by descending the melting pot after producing the meniscus with the desired diameter size from step (b); and (d) growing desired pure salt crystals by maintaining constant velocity of descending the melting pot.

With regard to the purification method of waste salts according to the present invention, the czochralski crystal growing process includes the steps of: (a) forming a meniscus around the pulling bar by fixing the pulling bar of the czochralski apparatus for growing crystals and descending the pulling bar and immersing the pulling bar in molten salt waste containing impurities; (b) producing the meniscus with desired diameter size by stopping descent of the pulling bar to obtain the desired diameter size and maintaining constant height of the pulling bar; (c) initiating taking out desired pure salt crystals from the molten salt by ascending the pulling bar after producing the meniscus with the desired diameter size from step (b); and (d) growing desired pure salt crystals by maintaining constant velocity of ascending the pulling bar.

For the purification method of waste salts according to the present invention, illustrative examples of the impurities are Cs salts, Sr salts or mixture thereof. However, the impurities are not particularly limited to the above examples, but include fluoride based salts so far as such salts are not mutually soluble.

The salts of Cs salts or Sr salts are preferably chloride salts, but are not particularly limited thereto so far as these are not mutually soluble.

The desired salt crystals are preferably Li salt crystals, but are not particularly limited thereto so far as these are not mutually soluble.

Salts of the Li salt crystals are preferably chloride salts, but are not particularly limited thereto so far as these are not mutually soluble.

For the purification method of waste salts according to the present invention, rotational velocity of the pulling bar ranges from 5 to 120 rpm, preferably 10 to 100 rpm and, more preferably 25 to 35 rpm to uniformly mix molten salt ingredients and to prevent vortex flow thereof, however, optimum conditions of the rotational velocity may be varied depending on compositional ingredients of the waste salts.

For the purification method of waste salts according to the present invention, descending velocity of the melting pot or ascending velocity of the pulling bar in step (d) ranges from 0.1 to 50 cm/h, preferably 0.5 to 30 cm/h and, more preferably 0.5 to 5 cm/h to sufficiently grow salt crystals, however, optimum conditions of the melting pot descending velocity or the pulling bar ascending velocity may be varied depending on compositional ingredients of the waste salts.

For the purification method of waste salts according to the present invention, surface temperature of the molten waste salt in step (a) is controlled in the range of 0.1 to 50° C., preferably 0.1 to 20° C. and, more preferably 5 to 10° C. higher than a liquidus line to actively grow salt crystals.

If the heating temperature is lower than the liquidus line, crystal growth velocity is so fast as to cause excessive increase of diameter of the crystals and no isolation of impurities. When the heating temperature is excessively higher than the liquidus line, crystal growth cannot be resulted.

Hereinafter, the purification method of the present invention using the czochralski crystal growing process will be described in detail with reference to the accompanying drawings.

Figure 4:
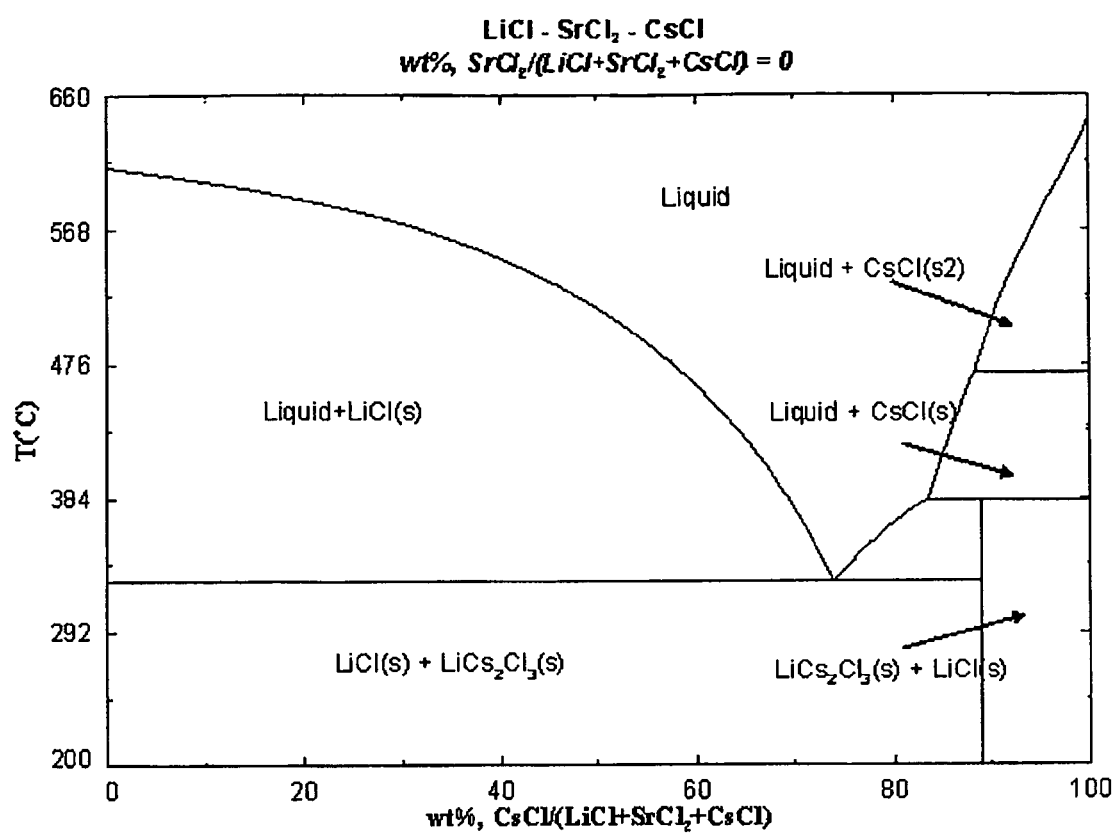
FIG. 4 illustrates a binary phase diagram for LiCl-(0 wt. %)$SrCl_2$—CsCl calculated by FactSage.
Figure 5:
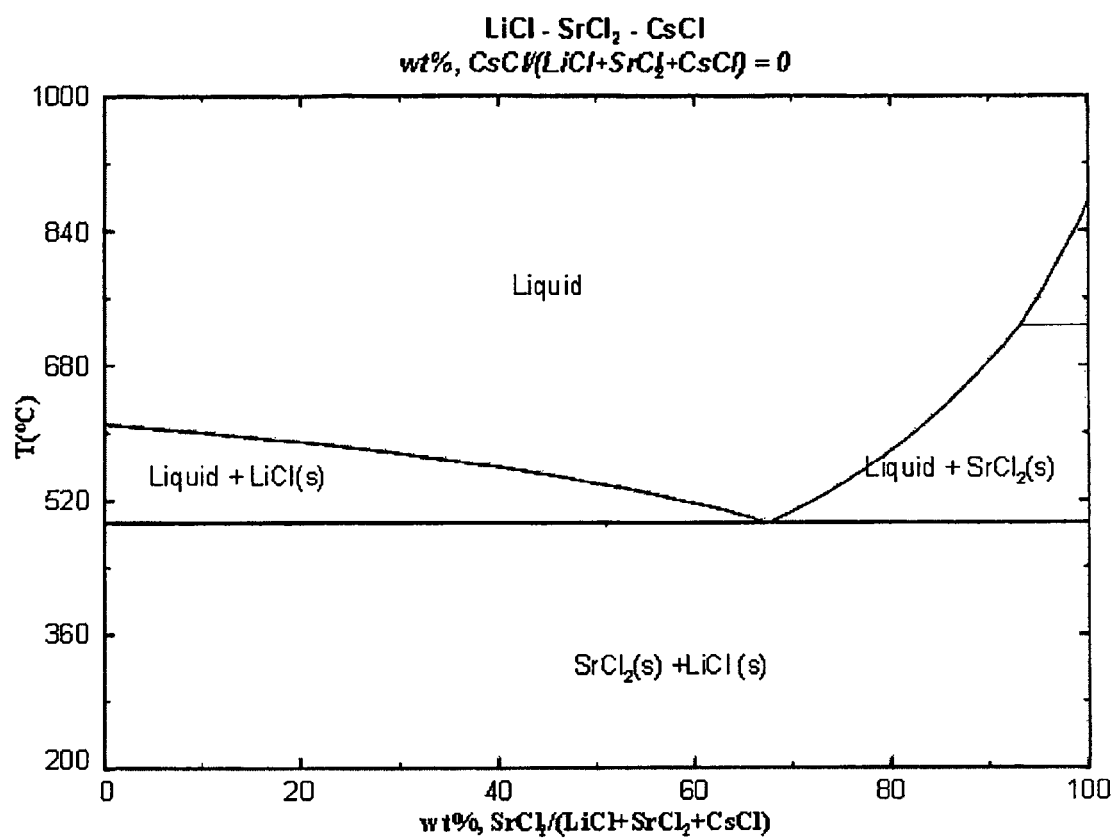
FIG. 5 illustrates a binary phase diagram for LiCl—$SrCl_2$-(0 wt. %)CsCl calculated by FactSage.
Figure 6:
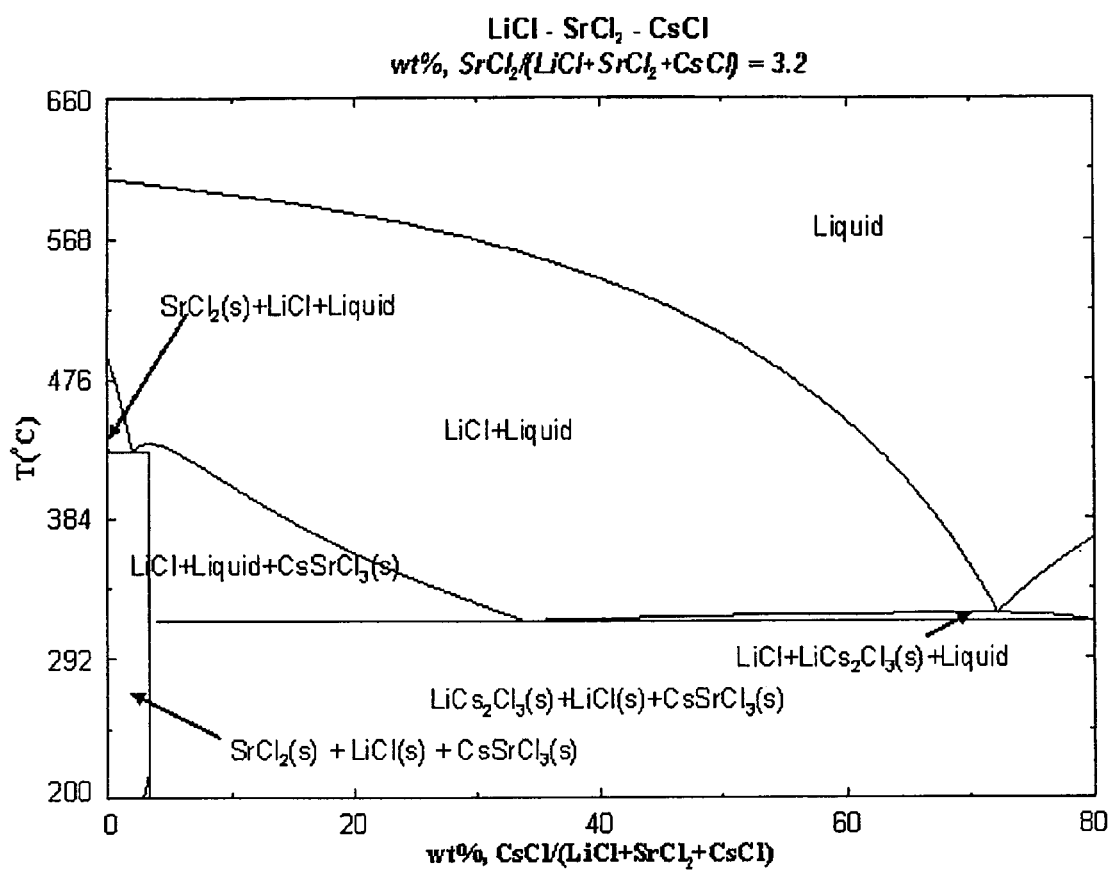
FIG. 6 illustrates a binary phase diagram for LiCl—$SrCl_2$—CsCl calculated by FactSage.

Principles of purifying the molten salt during a LiCl crystal growing process can be explained as shown in FIGS. 4 to 6.

FIGS. 4, 5 and 6 illustrate binary phase diagrams for phase equilibrium of LiCl, CsCl and $SrCl_2$ based molten salts drawn by FactSage, a commercially available database for thermodynamic properties. Particularly, FIG. 4 illustrates a binary phase diagram for LiCl-(0 wt. %)$SrCl_2$—CsCl calculated by FactSage; FIG. 5 illustrates a binary phase diagram for LiCl—$SrCl_2$-(0 wt. %)CsCl calculated by FactSage; and FIG. 6 illustrates a binary phase diagram for LiCl—$SrCl_2$—CsCl calculated by FactSage.

Referring to FIG. 4, LiCl—CsCl based molten salt has eutectic temperature of about 325° C. with CsCl content of 74 wt. %. Briefly, in order to isolate CsCl from LiCl molten salt containing CsCl with initial concentration of 10 wt. %, the molten salt underwent a crystal growing process at 600° C. with very low solidification velocity to generate LiCl crystals. While a liquid phase containing CsCl is not dissolved in a solid LiCl phase to result in segregation that CsCl is pushed out of LiCl crystals. The grown pure LiCl crystals have higher melting point than that of a molten salt mixture and are not re-dissolved within a limited execution limit, thereby continuously growing crystals.

Accordingly, CsCl is concentrated in the molten salt during LiCl crystal growth and temperature of the molten salt is decreased along the liquidus line to reach the lowest processing temperature of 325° C.

As shown in FIG. 5 for LiCL-$SrCl_2$ based molten salt, pure LiCl crystals are grown until the molten salt is concentrated to have $SrCl_2$ content of 68 wt. % as one of constitutional ingredients. Alternatively, in case of a combination of LiCl, CsCl and $SrCl_2$, a binary phase diagram shown in FIG. 6 can be obtained, in which the processing temperature is 322° C. for 72 wt. % of CsCl if $SrCl_2$ content is 3.2 wt. %. However, as a solid $SrCl_2$ phase is formed at 491° C., the pure LiCl crystals are recovered only until CsCl content reaches 53 wt. %.

Consequently, the present invention established specific processing conditions for recovery of desired pure salt from molten salt containing impurities in the range of possible theoretical concentration.

Compared to conventional techniques, for example, adsorption of Cs and Sr using zeolite as reported in Pereira C et al., Mater Res Soc Proc. 1999, vol 556, pp. 115-120 and Lexa D et al., Metallurgical and Materials Transactions B. 2001, 32B, 429-435, the purification method of the present invention needs no chemical adsorption agent. Alternatively, the present inventive method can isolate Cs as one of alkaline metals as well as Sr while a common zone refining process, especially, proposed by Hinks et al. in Materials Research Bulletin, vol. 9, pp. 53-64, 1974 isolates only Fe, Co, Ni and/or Ca elements.

Hereinafter, the present invention will be more particularly described by the preferred examples. However, these are intended to illustrate preferred embodiments of the present invention and do not limit the scope of the present invention.

EXAMPLE 1

Purification of LiCl Crystals from LiCl—CsCl Molten Salt

After defining initial concentration of CsCl to be 6 wt. % and maintaining surface temperature of LiCl—CsC molten salt generated by an electrolytic reduction process for simulated nuclear spent fuels at 605° C., a melting pot was moved upward to immerse a pulling bar in the molten salt contained in the melting pot while rotating the bar at 30 rpm, as indicated by 100 in FIG. 7.

A meniscus was observed around the pulling bar during the immersion step and, after 20 seconds, the melting pot was moved downward to initiate taking out pure salt crystals from the molten salt, as indicated by 110 in FIG. 7.

Crystals were grown while maintaining a velocity of descending the melting pot at 10 mm/hr as indicated by 120, to generate pure LiCl crystals as indicated by 130 in FIG. 7. As a result of chemical analysis, it was observed that the purified LiCl crystals have CsCl concentration of 0.28 wt. %.

FIG. 7 illustrates a process for growing pure LiCl crystals from LiCl—CsCl molten salt as described in Example 1.

EXAMPLE 2

Purification of LiCl Crystals from LiCl—CsCl—$SrCl_2$ Molten Salt

After defining initial concentrations of CsCl and $SrCl_2$ to be 5.9 wt. % and 3.2 wt. %, respectively, and maintaining surface temperature of LiCl—CsCl—$SrCl_2$ molten salt generated by an electrolytic reduction process for simulated nuclear spent fuels at 610° C., a pulling bar was moved downward and immersed in the molten salt contained in a melting pot while rotating the pulling bar at 10 rpm.

A meniscus was observed around the pulling bar during the immersion step and, after 20 seconds, the pulling bar was moved upward to initiate taking out pure salt crystals from the molten salt.

Crystals were grown while maintaining a velocity of ascending the pulling bar at 5, 20 and 40 mm/hr, respectively, to generate pure LiCl crystals.

As a result of chemical analysis for LiCl crystals based on the ascending velocity, it was observed that the purified LiCl crystals have each of Cs and Sr concentrations of 0.047 wt. % at the velocity of 5 mm/hr. When the velocity was 20 mm/hr, Cs and Sr concentrations were 0.4054 wt. % and 0.2474 wt. %, respectively. Also, for the velocity of 40 mm/hr, Cs and Sr concentrations were 0.9247 wt. % and 0.4678 wt. %, respectively.

Consequently, it was demonstrated that the ascending velocity preferably needs to be low to recover high purity LiCl crystals since content of impurities in the grown LiCl crystals is decreased as the ascending velocity is reduced.

As described above, the present invention can reuse salts such as LiCl salts by removing high heat generating nuclear species such as CsCl, $SrCl_2$, etc. contained in molten waste salts so that it can greatly decrease amount of high level wastes and reduce expenses for waste disposal, thereby being effectively used in applications for treatment of waste salts.

While the present invention has been described with reference to the preferred examples, these are intended to illustrate the invention and do not limit the scope of the present invention. It will be obvious to those skilled in the art that various modifications and/or variations may be made therein without departing from the spirit and scope of the present invention.

What is claimed is:

1. A czochralski apparatus for growing crystals, comprising:
    a melting pot having a heating part to dissolve raw salts at a controlled temperature;
    an ascending or descending device located at the center of a bottom end of the melting pot to move the melting pot upward or downward;
    a pulling bar located at the center of an upper end of the melting pot to take out desired pure salt crystals from molten raw salt containing impurities;
    a first fixation screw assembly for fixing salt crystals being in contact with the molten raw salts containing impurities; and
    a second fixation screw assembly for fixing salt crystals being in contact with the molten raw salts containing impurities,
    wherein each of the first and second fixation screw assembly includes a fixation screw for salt crystals mounted on the bottom end of the pulling bar capable of rotating, a thread portion for salt crystals formed on an outer surface of the fixation screw, and an exhaust port formed at an upper end portion of the fixation screw so as to enable the molten raw salts to be easily penetrated into the fixation screw,
    wherein the first and second fixation screw assemblies are apart from each other with a gap therebetween.

2. The apparatus according to claim 1, wherein the pulling bar is made of metallic materials.

3. The apparatus according to claim 1, wherein the impurities are one or two selected from the group consisting of Cs salts and Sr salts.

4. The apparatus according to claim 3, wherein the salts are chloride salts.

5. The apparatus according to claim 1, wherein the desired pure salt crystals comprise Li salt crystals.

6. The apparatus according to claim 5, wherein the salts are chloride salts.

7. A czochralski apparatus for growing crystals, comprising:
- a melting pot having a heating part to dissolve raw salts at a controlled temperature;
- a pulling bar located at the center of an upper end of the melting pot to take out desired pure salt crystals from molten raw salt containing impurities;
- an ascending or descending device located at the center of an upper end of the pulling bar to move the pulling bar upward or downward;
- a first fixation screw assembly for fixing salt crystals being in contact with the molten raw salts containing impurities; and
- a second fixation screw assembly for fixing salt crystals being in contact with the molten raw salts containing impurities,
- wherein each of the first and second fixation screw assembly includes a fixation screw for salt crystals mounted on the bottom end of the pulling bar capable of rotating a thread portion for salt crystals formed on an outer surface of the fixation screw, and an exhaust port formed at an upper end portion of the fixation screw so as to enable the molten raw salt to be easily penetrated into the fixation screw,
- wherein the first and second fixation screw assemblies are apart from each other with a gap therebetween.

8. The apparatus according to claim 7, wherein the pulling bar is made of metallic materials.

9. The apparatus according to claim 7, wherein the impurities are one or two selected from the group consisting of Cs salts and Sr salts.

10. The apparatus according to claim 9, wherein the salts are chloride salts.

11. The apparatus according to claim 7, wherein the desired pure salt crystals comprise Li salt crystals.

12. The apparatus according to claim 11, wherein the salts are chloride salts.

* * * * *